(12) United States Patent
Yang et al.

(10) Patent No.: US 10,341,049 B2
(45) Date of Patent: Jul. 2, 2019

(54) METHOD AND APPARATUS FOR PERFORMING A FORWARD ERROR CORRECTION (FEC) ENCODING OR DECODING IN A MULTIMEDIA SYSTEM

(71) Applicant: Samsung Electronics Co., Ltd., Suwon-si, Gyeonggi-do (KR)

(72) Inventors: Hyun-Koo Yang, Seoul (KR); Sung-Hee Hwang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 63 days.

(21) Appl. No.: 15/129,624

(22) PCT Filed: Mar. 30, 2015

(86) PCT No.: PCT/KR2015/003115
§ 371 (c)(1),
(2) Date: Sep. 27, 2016

(87) PCT Pub. No.: WO2015/147613
PCT Pub. Date: Oct. 1, 2015

(65) Prior Publication Data
US 2017/0149526 A1    May 25, 2017

(30) Foreign Application Priority Data
Mar. 28, 2014  (KR) .................. 10-2014-0037261

(51) Int. Cl.
*H04L 1/00*       (2006.01)
*G06F 11/10*     (2006.01)
(Continued)

(52) U.S. Cl.
CPC ........... *H04L 1/0041* (2013.01); *G06F 11/10* (2013.01); *H03M 13/13* (2013.01);
(Continued)

(58) Field of Classification Search
CPC ... H04L 1/0007; H04L 1/0008; H04L 1/0041; H04L 1/0045; H04L 1/0058;
(Continued)

(56) References Cited

U.S. PATENT DOCUMENTS 7,343,540 B2 *  3/2008  Khermosh ............ H04L 1/0057
                                                                   714/758
2009/0327842 A1 * 12/2009  Liu ....................... H04L 1/0057
                                                                   714/776
(Continued)

FOREIGN PATENT DOCUMENTS

EP      1648171 A1     4/2006
JP      2003-264590 A  9/2003
(Continued)

OTHER PUBLICATIONS

Park et al.; "Study of ISO/IEC 23008-1 DAM2 Header Compression and Cross Layer Interface"; International Organization for Standardization; Organisation Internationale De Normalisation; ISO/IEC JTC1/SC29/WG11; Coding of Moving Pictures and Audio; ISO/IEC JTC1/SC29/WG11; MPEG/N14355; Apr. 2014; pp. 1-27 (29 pages total); Valencia, Spain.

(Continued)

*Primary Examiner* — Kyle Vallecillo
(74) *Attorney, Agent, or Firm* — Jefferson IP Law, LLP

(57) ABSTRACT

The present invention relates to a method for generating, by a transmission device, a packet in a broadcasting and/or communication system, the method comprising the steps of: generating a first source symbol block consisting of one or more source symbols with the same length using a source packet block consisting of one or more source packets; performing a forward error correction (FEC) coding operation on the first source symbol block; generating a second source symbol block containing information about each source packet constituting the source packet block; and (Continued)

generating a second recovery symbol block with one or more recovery symbols by performing an FEC coding operation on the second source symbol block.

8 Claims, 10 Drawing Sheets

(51) Int. Cl.
  *H03M 13/13* (2006.01)
  *H03M 13/27* (2006.01)
  *H03M 13/00* (2006.01)
(52) U.S. Cl.
  CPC ... *H03M 13/2707* (2013.01); *H03M 13/6356* (2013.01); *H03M 13/6516* (2013.01); *H04L 1/0042* (2013.01); *H04L 1/0045* (2013.01); *H04L 1/0057* (2013.01); *H04L 1/0058* (2013.01); *H04L 2001/0093* (2013.01)
(58) Field of Classification Search
  CPC ...... H04L 1/0083; H04L 1/0084; G06F 11/08; G06F 11/10; G06F 11/1004; H03M 13/05; H03M 13/11; H03M 13/2906; H03M 13/356; H03M 13/3761; H03M 13/6356; H04N 19/00; H04N 19/89
  See application file for complete search history.

(56) References Cited

U.S. PATENT DOCUMENTS

| | | | |
|---|---|---|---|
| 2011/0231569 A1* | 9/2011 | Luby | H04N 21/23106 709/234 |
| 2012/0317461 A1* | 12/2012 | Hwang | H03M 13/2906 714/776 |
| 2013/0013982 A1* | 1/2013 | Hwang | H03M 13/05 714/776 |
| 2013/0094502 A1 | 4/2013 | Hwang | |
| 2013/0097474 A1 | 4/2013 | Hwang et al. | |
| 2013/0219240 A1 | 8/2013 | Myung et al. | |
| 2013/0227376 A1* | 8/2013 | Hwang | G06F 11/10 714/776 |
| 2013/0294447 A1 | 11/2013 | Myung et al. | |

FOREIGN PATENT DOCUMENTS

| | | |
|---|---|---|
| KR | 10-2012-0137203 A | 12/2012 |
| KR | 10-2013-0006380 A | 1/2013 |
| KR | 10-2013-0095231 A | 8/2013 |
| WO | 2013/055180 A1 | 4/2013 |
| WO | 2013/168964 A1 | 11/2013 |

OTHER PUBLICATIONS

Park; "Study of ISO/IEC 23008-1 DAM2 Header Compression and Cross Layer Interface"; International Organization for Standardization Organisation; Internationale De Normalisation; ISO/IEC JTC1/SC29/WG11; Coding of Moving Pictures and Audio; ISO/IEC JTC1/SC29/WG11; MPEG/N35366; Oct. 2014; pp. 1-28 (30 pages total); Strasbourg, France.

Hwang; "FEC Method for Packet Drop & SSBG Mode2"; International Organisation for Standardisation; Organisation Internationale De Normalisation; ISO/IEC JTC1/SC29/WG11; Coding of Moving Pictures and Audio; ISO/IEC JTC1/SC29/WG11; MPEG12014/m33455; Mar. 2014; pp. 1-5; Valencia, Spain.

ISO/IEC; "Information Technology—High Efficiency Coding and Media Delivery in Heterogeneous Environments—Part 1: MPEG Media Transport (MMT)"; ISO/IEC FDIS 23008-1; ISO/IEC JTC1/SC 29; ISO/IEC DIS 23008-1; ISQ/IEC JTC1/SC 29/WG 11; Apr. 26, 2013; pp. 1-92 (98 pages total); Geneva, Switzerland.

Japanese Patent Office; Japanese Office Action dated Oct. 2, 2018, issued in a counterpart Japanese application No. 2016-559620.

* cited by examiner

| B[0,0] | B[0,1] | B[0,2] | B[0,3] | B[0,4] | B[0,5] | B[0,6] | B[0,7] |
|---|---|---|---|---|---|---|---|
| B[0,8] | B[0,9] | B[0,10] | B[0,11] | B[0,12] | 0 | 0 | 0 |
| B[1,0] | B[1,1] | B[1,2] | B[1,3] | B[1,4] | B[1,5] | 0 | 0 |
| B[2,0] | B[2,1] | B[2,2] | B[2,3] | B[2,4] | B[2,5] | B[2,6] | B[2,7] |
| B[2,8] | B[2,9] | 0 | 0 | B[3,0] | B[3,1] | B[3,2] | B[3,3] |
| B[3,4] | B[3,5] | B[3,6] | B[3,7] | B[3,8] | B[3,9] | B[3,10] | B[3,11] |
| B[3,12] | B[3,13] | 0 | 0 | 0 | 0 | 0 | 0 |

← Symbol element size T/2 (= 4 bytes) → | ← Symbol element size T/2 (= 4 bytes) →

↕ Source symbol block length K (=7)

↔ Symbol size T (= 8 bytes)

METHOD AND APPARATUS FOR PERFORMING A FORWARD ERROR CORRECTION (FEC) ENCODING OR DECODING IN A MULTIMEDIA SYSTEM

PRIORITY

This application is a National Phase Entry of PCT International Application No. PCT/KR2015/003115, which was filed on Mar. 30, 2015, and claims a priority to Korean Patent Application No. 10-2014-0037261, which was filed on Mar. 28, 2014, the contents of which are incorporated herein by reference.

TECHNICAL FIELD

The present disclosure relates generally to a technique for generating and recovering a packet in a broadcasting and/or communication system, and more particularly, to an apparatus and method for efficiently recovering a lost packet using an error correction code

BACKGROUND ART

Due to a change in the content consumption trend and the increase of high-capacity content such as high definition (HD) content and ultra-high definition (UHD) content, data congestion becomes severe over a network in communication systems. As a result, content transmitted by a signal transmitter (for example, host A) does not normally arrive at a signal receiver (for example, host B), and all or part of the transmitted content is lost on a route.

In general, data is transmitted in packets and thus data loss occurs in units of a transmission packet. Therefore, once a transmission packet is lost over a network, the signal receiver fails to receive the lost transmission packet and thus does not know data included in the lost transmission packet, thereby causing various types of user inconveniences including audio quality degradation, video quality degradation, screen tearing, subtitle omission, and file loss.

To recover data lost over a network, repair symbols generated by forward error correction (FEC) coding may be added to a source block including a predetermined number of packets and then transmitted. In general, the size (or length) of data (that is, source payload) included in a packet may be fixed or variable. That is, the source payload may have a fixed or variable packet size. For example, although a moving picture experts group 2 (MPEG2) transport stream (TS) has a fixed packet size of 188 bytes, including a 4-byte header and 184-byte payload, a real-time transport protocol (RTP) packet or an MPEG media transport (MMT) packet does not always have a fixed size.

Accordingly, if a variable packet size is used, the signal transmitter may generate a source block by adding padding data to data in order to make the sizes of actually transmitted packets equal, and then perform FEC coding on the generated source block.

However, in the case where a source block is generated by adding padding data to data and then FEC-encoded as described above, when an FEC decoder recovers a packet lost over a network (channel) during FEC decoding, the FEC decoder recovers the source block (that is, the source block including packet data). In this context, to recover actual transmission packets, the FEC decoder needs to accurately determine the size of the packets before data is padded with padding data.

DISCLOSURE

Technical Problem

An object of the present disclosure is to provide a method and apparatus for generating and recovering a packet in a broadcasting and/or communication system.

Another object of the present disclosure is to provide a method and apparatus for generating and recovering a packet, which increase data recovery efficiency in a broadcasting and/or communication system.

Another object of the present disclosure is to provide a method and apparatus for generating and recovering a packet, which can achieve efficient transmission reliability in a broadcasting and/or communication system.

Another object of the present disclosure is to provide a method and apparatus for generating and recovering a packet, which enable a receiver to determine source symbols corresponding to a source packet in a source block irrespective of reception or non-reception of the source packet in a broadcasting and/or communication system.

Another object of the present disclosure is to provide a method and apparatus for generating and recovering a packet, which can detect the starting point of a lost packet in a recovered source symbol of a recovered source block in a broadcasting and/or communication system.

Another object of the present disclosure is to provide a method and apparatus for generating and recovering a packet, which can remove padding data in a recovered source symbol of a wholly or partially recovered source block in a broadcasting and/or communication system.

Another object of the present disclosure is to provide a method and apparatus for generating and recovering a packet, which can recover all source packets included in a recovered source symbol of a wholly or partially recovered source block in a broadcasting and/or communication system.

Technical Solution

In an aspect of the present disclosure, a method for generating a packet by a transmission apparatus in a broadcasting and/or communication system includes generating a first source symbol block including one or more source symbols of the same length, using a source packet block including one or more source packets, performing a forward error correction (FEC) encoding operation on the first source symbol block, generating a second source symbol block including information about each of the source packets of the source packet block, and generating a second repair symbol block including one or more repair symbols by performing an FEC encoding operation on the second source symbol block. One source symbol includes one or more symbol elements in the first source symbol block, and the second source symbol block includes information about the length of at least one source packet included in the source packet block.

In another aspect of the present disclosure, an apparatus for generating a packet at a transmission apparatus in a broadcasting and/or communication system includes a first FEC encoder for generating a first source symbol block including one or more source symbols of the same length, using a source packet block including one or more source packets, and performing an FEC encoding operation on the first source symbol block, and a second FEC encoder for generating a second source symbol block including information about each of the source packets of the source packet block, and generating a second repair symbol block including one or more repair symbols by performing an FEC encoding operation on the second source symbol block. One source symbol includes one or more symbol elements in the first source symbol block, and the second source symbol block includes information about the length of at least one source packet included in the source packet block.

In another aspect of the present disclosure, a method for recovering a packet by a reception apparatus in a broadcasting and/or communication system includes receiving packets by demodulating and processing a signal received from a transmission apparatus, acquiring FEC configuration information from the received packets, constructing a second reception symbol block based on the FEC configuration information, recovering a second source symbol block, if the second source symbol block is successfully recovered, constructing a first reception symbol block, and recovering a first source symbol block including one or more source symbols of the same length. The first source symbol block is constructed with the one or more source symbols of the same length, using a source packet block including one or more source packets, one source symbol includes one or more symbol elements in the first source symbol block, and the second source symbol block includes information about the length of at least one source packet includes in the source packet block.

In another aspect of the present disclosure, an apparatus for recovering a packet at a reception apparatus in a broadcasting and/or communication system includes a receiver for receiving packets by demodulating and processing a signal received from a transmission apparatus, and a controller for acquiring FEC configuration information from the received packets, constructing a second reception symbol block based on the FEC configuration information, recovering a second source symbol block, if the second source symbol block is successfully recovered, constructing a first reception symbol block, and recovering a first source symbol block including one or more source symbols of the same length. The first source symbol block is constructed with the one or more source symbols of the same length, using a source packet block including one or more source packets, one source symbol includes one or more symbol elements in the first source symbol block, and the second source symbol block includes information about the length of at least one source packet included in the source packet block.

Advantageous Effects

The present disclosure can provide an apparatus and method for efficiently transmitting and receiving packets in a broadcasting/communication system.

The present disclosure can correct an error efficiently in a broadcasting/communication system.

BRIEF DESCRIPTION OF THE DRAWINGS

FIG. 4 illustrates an exemplary configuration of a first source symbol block according to an embodiment of the present disclosure;

MODE FOR CARRYING OUT THE INVENTION

Figure 1:
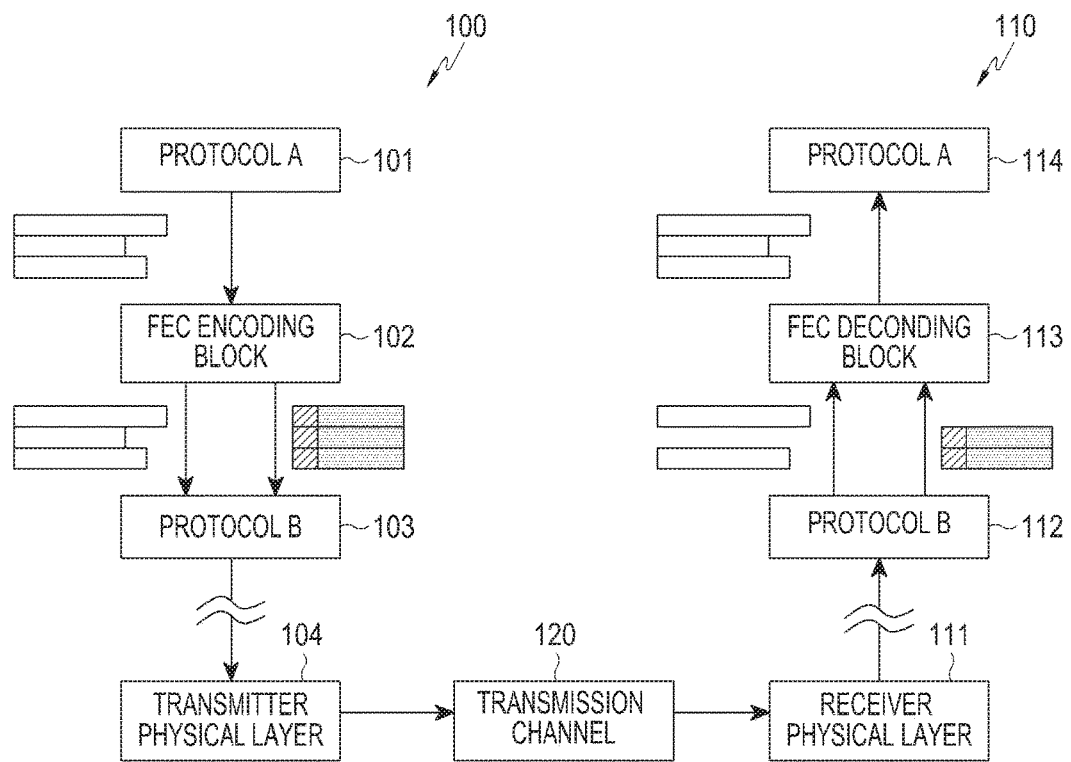
FIG. 1 is a block diagram of a transmitter and a receiver which use a higher-layer error correction code according to an embodiment of the present disclosure.

A detailed description of known functions or constructions will be omitted lest it should obscure the subject matter of the present disclosure. Terms used herein are defined in consideration of functions according to the present disclosure and may be changed according to the intention of a user or an operator, or customs. Therefore, the definition should be made based on the comprehensive contents of the present disclosure.

A description will be given of the present disclosure in the context of a communication system being an MPEG-H Part 1 MPEG (moving picture experts group) media transport (MMT) system, by way of example. However, it is to be clearly understood that aside from the MMT system, the communication system may be any of communication systems such as an evolved packet system (EPS), a long-term evolution (LTE) mobile communication system, an LTE-advanced (LTA-A) mobile communication system, and an institute of electrical and electronics engineers (IEEE) 802.16m communication system.

Embodiments of the present disclosure as described below propose an apparatus and method for generating and recovering a packet, which can efficiently recover a lost data packet in every electronic device, such as a portable phone, a TV, a computer, an electronic blackboard, a tablet computer, and an e-book reader, which is capable of providing various multimedia services including video conference/call as well as high-capacity content like high definition (HD) content, ultra-high definition (UHD) content over a network.

While a specific FEC coding scheme is not described in the embodiments of the present disclosure, it is to be understood that the FEC coding scheme is not limited to a specific FEC coding scheme such as a Reed-Solomon (RS) code, a low density parity check (LDPC) code, a turbo code, a raptor code, XOR, or a Pro-MPEG FEC code.

The embodiments of the present disclosure and terms used to describe the embodiments are based on the assumption that a packet lost over a network is recovered using a repair symbol. However, the present disclosure is also applicable to a situation in which a packet having an error in a transmission route as well as a packet lost over a network is subjected to error correction, and a lost packet and an erroneous packet are co-existent.

An operation for generating a repair packet by FEC-encoding a source packet block including one or more source packets is performed as follows. A source symbol block including source symbols of the same length is constructed out of the source packet block in a predetermined rule. A repair symbol block including repair symbols are generated by FEC-encoding the source symbol block used as an input, and the generated repair symbols are converted to FEC repair packets, for transmission, and then transmitted. In general, the source symbols and the repair symbols are of the same length.

While the source symbols have the same length as described above, the source packets may have different lengths. Therefore, one source packet may be allocated to a plurality of source symbols according to the length of the source packet, and padding data are needed to match the source symbol length. Therefore, to recover a lost source packet using a recovered source symbol block, a receiver should determine source symbols that form the lost source packet and remove padding data.

Terms used in describing the embodiments of the present disclosure are defined as follows.
  FEC code: an error correction code used to correct an error symbol or an erasure symbol.
  Source symbol: a unit of data used during FEC encoding.
  Repair symbol: a coding symbol that is not a source symbol.
  Source packet: a packet protected by FEC coding.
  Source packet block: a segmented set of source packets of an FEC source flow, which are to be protected as a single block.
  Source symbol block: a set of source symbols generated from a single source packet block.
  Repair symbol block: a set of repair symbols which can be used to recover lost source symbols.
  Coding symbol block: a set of coding symbols from the encoding process of a source symbol block.
  Coding symbol: a unit of data generated by the encoding process. Here, source symbols are part of the coding symbols.
  FEC repair packet: a packet with a repair FEC payload ID to deliver one or more repair symbols of a repair symbol block.
  FEC repair packet block: a set of FEC repair packets to deliver a repair symbol block.
  FEC Payload ID: an identifier that identifies the contents of an MMT packet with respect to an MMT FEC scheme
  Repair FEC payload ID: an FEC payload ID specifically for use with repair packets.
  MMT: the international standard being designed to efficiently transmit MPEG data.
  FEC source flow: a flow of source packets protected by a single instance of the MMT FEC scheme
  FEC scheme: a specification that defines the additional protocol aspects required to use FEC codes.
  FEC code: an algorithm for encoding data such that the encoded data flow is resilient to data loss.
  FEC repair flow: a data flow carrying repair symbols to protect a source flow.
  FEC encoded flow: a logical set of flows that consists of an FEC source flow and its associated one or more FEC repair flows.
  Asset: a data entity containing data with the same transport characteristics and that is composed of one of more media processing units (MPUs) with the same Asset ID.
  Media processing unit: a generic container for independently decodable timed or non-timed data, that is media codec agnostic.
  Package: a logical collection of data, which is composed of one or more Assets and their related Asset Delivery Characteristics, and Composition Information.
  MMT packet: a formatted unit of data generated or consumed according to the MMT protocol.
  MMT payload: a formatted unit of data to carry the package or signaling message either using MMT protocol or Internet application layer transport protocols (e.g. real time protocol (RTP)).
  MMT protocol: an application layer transport protocol for delivering MMT payload over an Internet protocol (IP) network.

With reference to FIG. 1, the configuration of a communication system according to an embodiment of the present disclosure will be described below.

FIG. 1 is a block diagram of a transmitter and a receiver which use a higher-layer error correction code according to an embodiment of the present disclosure.

Referring to FIG. 1, a transmitter 100 includes a protocol A block 101 corresponding to an FEC higher-layer protocol, an FEC encoding block 102, a protocol B block 103 corresponding to an FEC lower-layer protocol, and a transmitter physical layer block 104.

Transmission packets output from the protocol A block 101 are converted to source packets 130, and the source packets 130 are provided to the FEC encoding block 102. Although the source packets may generally be formatted differently from the transmission packets, it is assumed that the transmission packets and the source packets have the same format in FIG. 1.

The FEC encoding block 102 constructs a source packet block which is a collection of source packets, generates repair symbols through FEC encoding, adds repair FEC payload IDs 132 to repair payload 131 including one or more repair symbols, and provides the repair payload 131 with the repair FEC payload IDs 132 to the protocol B block 103. Repair payload added with a repair FEC payload ID is referred to as an FEC repair packet. The repair FEC payload IDs include information about the lengths of the source packets included in the source packet block.

While the FEC encoding block 102 is shown in FIG. 1 as interposed between the protocol A block 101 and the protocol B block 103, the FEC encoding block 102 may be configured to include the protocol A block 101 and the FEC encoding block 102 in some implementation. In this case, an FEC repair packet may include a protocol header to execute the functionality of the protocol A block 101. The protocol A block 101 including the FEC encoding block 102 may include a multiplexer for multiplexing a source packet and an FEC repair packet into one packet flow.

More specifically, the FEC encoding block 102 includes a first FEC encoder and a second FEC encoder.

The first FEC encoder may generate a first source symbol block including one or more source symbols of the same length out of a source packet block including one or more source packets, and perform FEC encoding on the first source symbol block.

The second FEC encoder may generate a second source symbol block including information about each of the source packets included in the source packet block, and generate a second repair symbol block including one or more repair symbols by performing FEC encoding on the second source symbol block. One source symbol in the first source symbol block may include one or more source elements, and the second source symbol block may include information about the length of at least one packet included in the source packet block.

The transmitter physical layer block 104 converts the source packets and the FEC repair packets to a signal suitable for transmission, and transmits the signal. Various layers may exist between the protocol B block 103 and the transmitter physical layer block 104. A description of specific configurations of the various layers will not be provided herein because the various layers are not related to the subject matter of the present disclosure.

A receiver 110 includes a receiver physical layer block 111, a protocol B block 112 corresponding to the FEC lower-layer protocol, an FEC decoding block 113, and a protocol A block 114 corresponding to the FEC higher-layer protocol.

The receiver physical layer block 111 interprets a signal received on a transmission channel 120 and provides the interpreted signal to the protocol B block 112. As is the case with the transmitter 100, various layers may exist between the protocol B block 112 and the receiver physical layer block 111, and a description of specific configurations of the various layers will not be provided herein because the various layers are not related to the subject matter of the present disclosure.

The protocol B block 112 interprets the received signal or received packets and provides received FEC packets to the FEC decoding block 113. A part of FEC packets transmitted by the transmitter may be lost due to network congestion and errors generated at the physical layer and thus may not be provided to the FEC decoding block 113.

The FEC decoding block 113 recovers lost source packets by performing FEC decoding on the received FEC packets and provides the recovered source packets along with the received source packets to the protocol A block 114. If the present disclosure is applied to an MMT system, a source packet is an MMT packet, and an FEC repair packet is an MMT packet including a repair FEC payload ID and a repair symbol.

The FEC decoding block 113 (or a controller) acquires FEC configuration information from the packets received from the transmitter, constructs a second reception symbol block based on the FEC configuration information, recovers a second source symbol block, if succeeding in recovering the second source symbol block, constructs a first reception symbol block, and recovers a first source symbol block including one or more source symbols of the same length. The first source symbol block includes one or more source symbols of the same length generated out of a source packet block including one or more source packets, and one source symbol in the first source symbol block includes one or more source elements. The second source symbol block may include information about the length of at least one source packet included in the source packet block.

Figure 2:
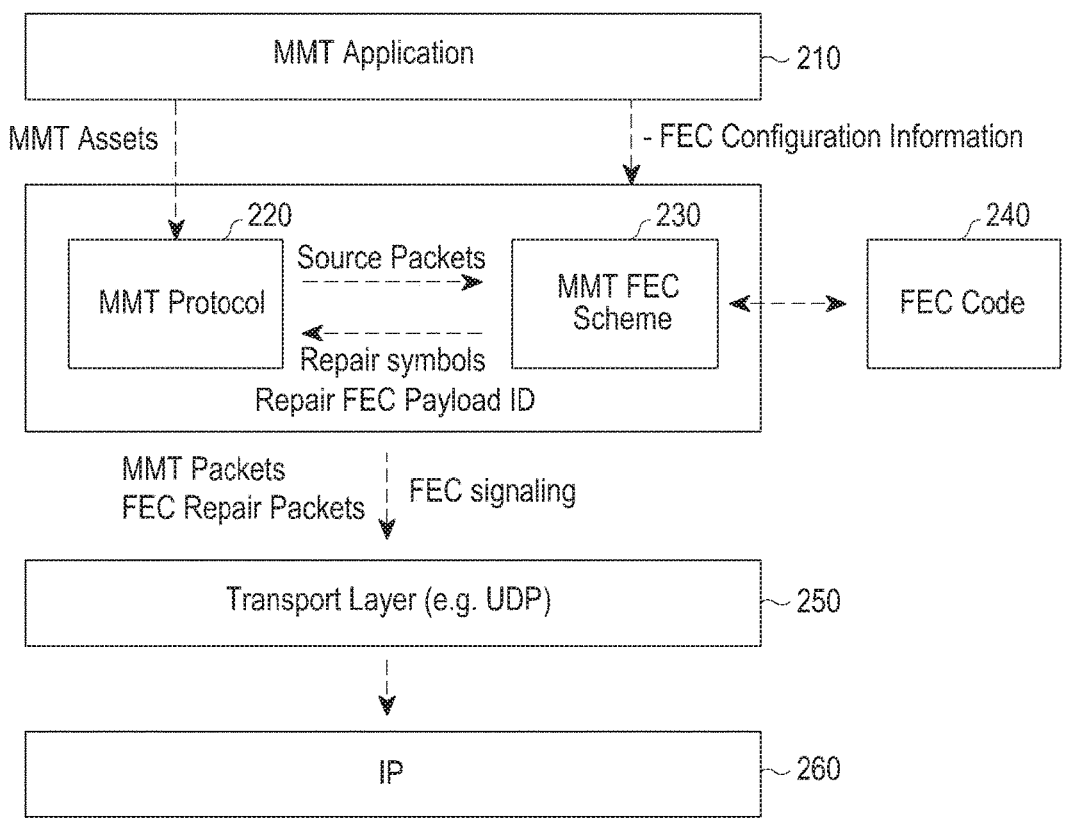
FIG. 2 schematically illustrates the application layer-forwarding error correction (AL-FEC) architecture of an MPEG media transport (MMT) system according to an embodiment of the present disclosure.

FIG. 2 schematically illustrates the application layer-forwarding error correction (AL-FEC) architecture of an MMT system.

An MMT application 210 determines MMT assets to be transmitted with AL-FEC protection and provides the determined MMT assets to an MMT protocol 220. Also, the MMT application 210 provides AL-FEC-related configuration information (that is, FEC configuration information) to an MMT FEC scheme 230.

The MMT protocol 220 packetizes the received assets into MMT payloads (MMTPs), generates source packets by adding MMT packet headers to the MMTPs, and provides a source packet block with a predetermined number of source packets to the MMT FEC scheme 230. In an embodiment of the present disclosure, the source packets may be multiplexed with later-described FEC repair packets and transmitted to an IP 260 through a transport layer 250 such as a user datagram protocol (UDP).

The MMT FEC scheme 230 generates a first source symbol block and a second source symbol block out of each received source packet block based on the FEC configuration information received from the MMT application 210 in a given source symbol block generation scheme. The source symbol block generation scheme according to an embodiment of the present disclosure is indicated by the FEC configuration information. If the FEC configuration information indicates the source symbol block generation scheme according to the embodiment of the present disclosure, the MMT FEC scheme 230 generates a source symbol block according to an embodiment of the present disclosure.

The FEC configuration information may be transmitted in an MMT packet having a separate format or in a separate protocol to the receiver.

After generating the first source symbol block and the second source symbol block, the MMT FEC scheme 230 provides the first and second source symbol blocks to an FEC code 240. The FEC code 240 generates a first repair symbol block and a second repair symbol block out of the first source symbol block and the second source symbol block, respectively, and provides the first repair symbol block and the second repair symbol block to the MMT FEC scheme 230. The MMT FEC scheme 230 generates repair FEC payload IDs and provides the repair FEC payload IDs along with repair symbols received from the FEC code 240 to the MMT protocol 220. The repair symbols included in the second repair symbol block include information used to recover information about the lengths of the source packets included in the source packet block. The information may be included as a part of the repair FEC payload IDs or configured as a separate component and provided to the MMT protocol 220.

The MMT protocol 220 adds repair FEC payload IDs to the repair symbols included in the received first repair symbol block, generates FEC repair packets by further adding MMT payload headers and MMT packet headers, and transmits the FEC repair packets to the IP 260 through the transport layer 250 such as the UDP. In an embodiment of the present disclosure, data units added during the FEC packet generation process may be added partially integrally. For example, if the repair symbols of the second repair symbol block are included as parts of the repair FEC payload IDs, the operation for adding a plurality of symbol blocks included in the second repair symbol may be omitted. In another example, the MMT payload headers may also be omitted.

While it has been described for the convenience of description that FEC source packets and FEC repair packets are generated and transmitted on a source packet block basis, it is preferred in an actual network environment that the MMT protocol 220 provides generated source packets to the MMT FEC scheme 230 simultaneously with outputting the source packets to the transport layer 250, stores the source packets in its internal memory, generates a first source symbol block and a second source symbol block out of a source packet block at the moment it receives the last source packet of the source packet block so that the FEC code 240 may generate first and second repair symbol blocks, provides repair symbols included in the generated repair symbol blocks along with FEC repair payload IDs to the MMT protocol 220 so that the MMT protocol 220 generates and transmits FEC repair packets.

According to an embodiment of the present disclosure, a communication system includes information that distinguishes a source packet from another source packet in the source packet. For example, an MMT packet header may include the following three fields.

packet_id (16 bits)—this field is an integer value that can be used to distinguish one asset from another. The value of this field is derived from the asset_id of the asset where this packet belongs to. The mapping between the packet_id and the asset_id is signaled by the MMT package table as part of a signaling message. Separate values will be assigned to signaling messages and FEC repair flows. The packet_id is unique throughout the lifetime of the delivery session and for all MMT flows delivered by the same MMT sending entity. For AL-FEC, the mapping between packet_id and the FEC repair flow is provided in the AL-FEC message.

packet_sequence_number (32 bits)—an integer value that is used to distinguish packets that have the same packet_id. The value of this field starts from an arbitrary value and will be incremented by one for each MMTP packet received. It wraps around to '0' after the maximum value is reached.

packet_counter (32 bits)—an integer value for counting MMTP packets. It is incremented by 1 when an MMTP packet is sent regardless of its packet_id value. This field starts from an arbitrary value and wraps around to '0' after its maximum value is reached.

The FEC scheme selects one of a plurality of source symbol generation schemes including a later-described source symbol generation scheme, constructs a first source symbol block according to the selected source symbol generation scheme, and performs FEC encoding on the first source symbol block. Herein, FEC configuration information and FEC payload IDs include information needed for the receiver to perform the used source symbol generation scheme, including information indicating the used source symbol generation scheme and information about the length of repair symbols.

Figure 3:
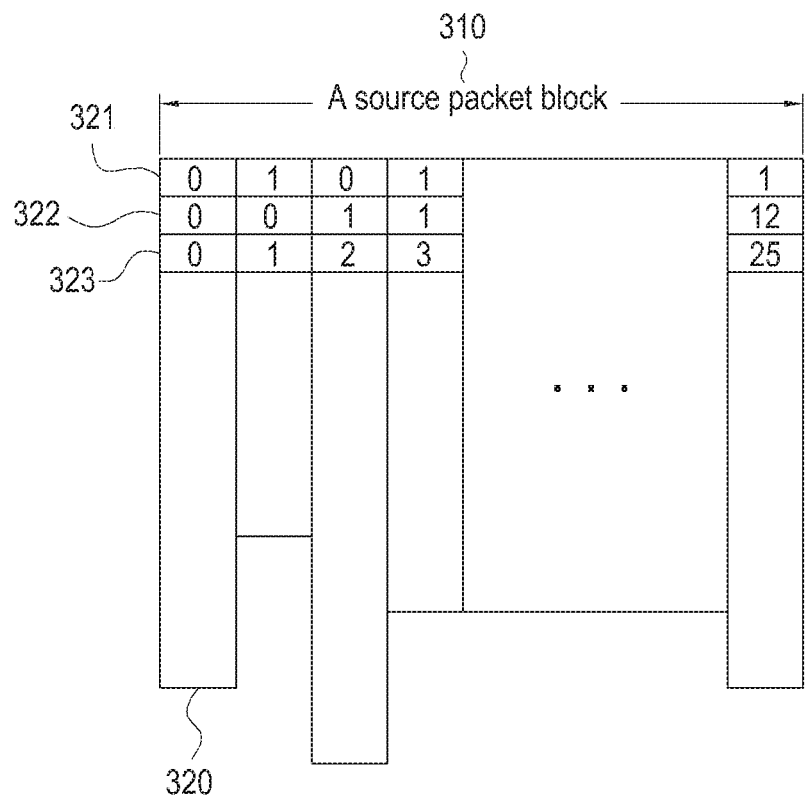
FIG. 3 illustrates a source packet block according to an embodiment of the present disclosure.

FIG. 3 illustrates a source packet block according to an embodiment of the present disclosure. Referring to FIG. 3, a source packet block 310 includes source packets 320 of variable lengths, and each of the source packets 320 includes a packet_id field 321 for packet grouping, a packet_sequence_number field 322 for identifying packets of the same group (having the same packet_id), and a packet_counter field 323 for identifying a packet irrespective of a packet_id. Besides the three fields, the source packets 320 may further have fields for executing other transmission-related functions in MMT packet headers, in addition to the above-described fields, which will not be descried in detail herein because the fields are not related to the subject matter of the present disclosure. Among the three fields, a packet may be identified just with the packet_id field 321 and the packet_sequence_number field 322. Also, since a packet may be determined just with the packet_counter field 323, all of the three fields are not always needed.

According to an embodiment of the present disclosure, the order of the source packets 320 in the source packet block 310 illustrated in FIG. 3 is determined using the values of the above-described three fields. For the convenience of description, methods for determining the order of source packets in a source packet block will be described later.

According to an embodiment of the present disclosure, a first source symbol block is constructed in the following manner.

If the length of a source symbol is T, the first source symbol block may be regarded as a two-dimensional array divided into m areas each having a size T/m. Herein, m represents the number of symbol elements. If T is not a multiple of m, the areas are divided into areas of length [T/m]+1 and areas of length [T/m]. Subsequently, when needed, given source packets are added with additional information and sequentially arranged in the two-dimensional array in such a manner that each source packet may not exceed the symbol size. In another embodiment, if m is given, T may be defined to be a multiple of m.

Each source packet should start to be arranged in a row in which the m areas start, and a predetermined value such as 0 is always allocated to the last part of an area in which the last data of a source packet added with additional information is allocated in a last row in which the source packet is arranged.

A zero padding of T/M or more bytes may be applied between arranged source packets according to a system requirement. However, to minimize a zero padding ratio, a maximum zero padding length is set to be smaller than T/m. Therefore, a source packet to be arranged after one source packet added with additional information is arranged may be arranged, starting from the starting point of an area next to an area in which last data of the source packet is allocated in a last row of the source packet. If the last data is allocated to the last $m^{th}$ area, the next source packet starts in the first area of the next row.

FIG. 4 illustrates an example in which for T=8 and m=2, a first source symbol block 400 is constructed with four source packets having lengths of 13, 6, 10, and 14, respectively.

In FIG. 4, each entry B[i,j] of the first source symbol block represents binary data, specifically a $(j+1)^{th}$ byte of an $(i+1)^{th}$ source packet.

In the first source symbol block 400, each row corresponds to one source symbol. If a symbol element is defined by sub-dividing each source symbol by T/m in each divided area, each source symbol of the first source symbol block includes two symbol elements of length 4. That is, the first source symbol block 400 includes 7 source symbols, in other words, 14 symbol elements.

It is assumed that a first source symbol block with K source symbols is constructed out of a source packet block with K' source packets in the above first source symbol block configuration scheme. It is also assumed that a maximum length of a source packet is 65535 (2^16−1) bytes. If K is equal to or larger than K', that is, if the number of source symbols in the first source symbol block is equal to or larger than the number of source packets in the source packet block, a second source symbol block configuration scheme according to an embodiment of the present disclosure is given as follows. A second source symbol block includes K source symbols each having a length of 2 bytes. Each of the first to Kth source symbols has the length of a source packet corresponding to its turn as its value, and each of source symbols after the Kth source symbol has a value of 0.

Figure 5:
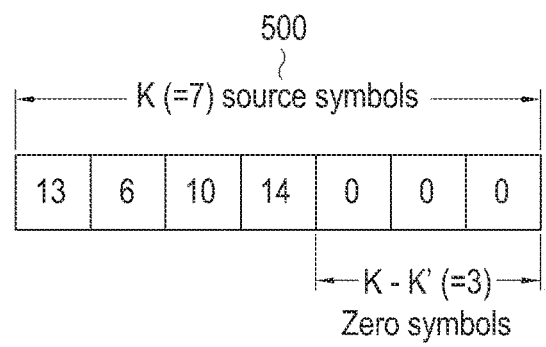
FIG. 5 illustrates an exemplary configuration of a second source symbol block according to an embodiment of the present disclosure.

FIG. 5 illustrates an exemplary second source symbol block, in the case where the first source symbol block 400 illustrated in FIG. 4 is constructed with four source packets having lengths of 13, 6, 10, and 14, respectively.

The second source symbol block generated in the above scheme includes as many symbols as the first source symbol block. However, the second source symbol block may include a source symbol having the predetermined value (0), which reduces the coding rate of the FEC code. Accordingly, if the same FEC code is used, the second source symbol block is robust against packet loss over a network, compared to the first source symbol block.

In an embodiment of the present disclosure, a transmitter generates a first repair symbol block by performing FEC encoding on the first source symbol block, and a second repair symbol block by performing FEC encoding on the second source symbol block, and transmits an FEC repair packet including at least one repair symbol of the first repair symbol block and at least one repair symbol of the second repair symbol block, along with a source packet. The FEC repair packet includes a repair FEC payload ID.

The repair FEC payload ID may vary depending on the order of arranging source packets in the source packet block. In an embodiment of the present disclosure, packets are arranged using one of one or more preset packet arrangement scheme, and the used packet arrangement scheme is indicated to a receiver by FEC configuration information.

According to an embodiment of the present disclosure, a first packet arrangement scheme is performed as follows. In the first packet arrangement scheme, a source packet is arranged based on the packet_id field 321 and the packet_sequence_number field 322 of the source packet. More specifically, source packets having the same packet_id are arranged in an ascending order of their packet_sequence_number values, and the order of packet_id values is indicated by the FEC configuration information.

Figure 6:
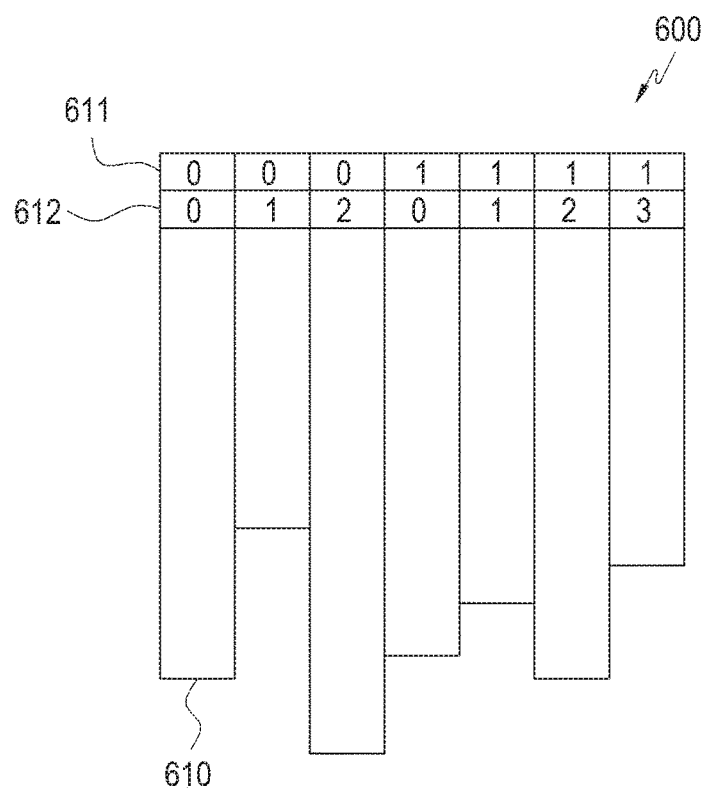
FIG. 6 illustrates an exemplary source packet block configured by a first packet arrangement scheme according to an embodiment of the present disclosure.

FIG. 6 illustrates an exemplary source packet block 600 arranged according to the above-described first packet arrangement scheme.

Referring to FIG. 6, the source packet block 600 includes seven source packets 610, and each source packet 610 includes a packet_id field 611 and a packet_sequence_number field 612 in a header.

In a second packet arrangement scheme according to an embodiment of the present disclosure, a source packet is arranged based on its packet_counter field 323. More specifically, source packets are arranged in an ascending order of the values of the packet_counter fields irrespective of the packet_id fields.

Figure 7:
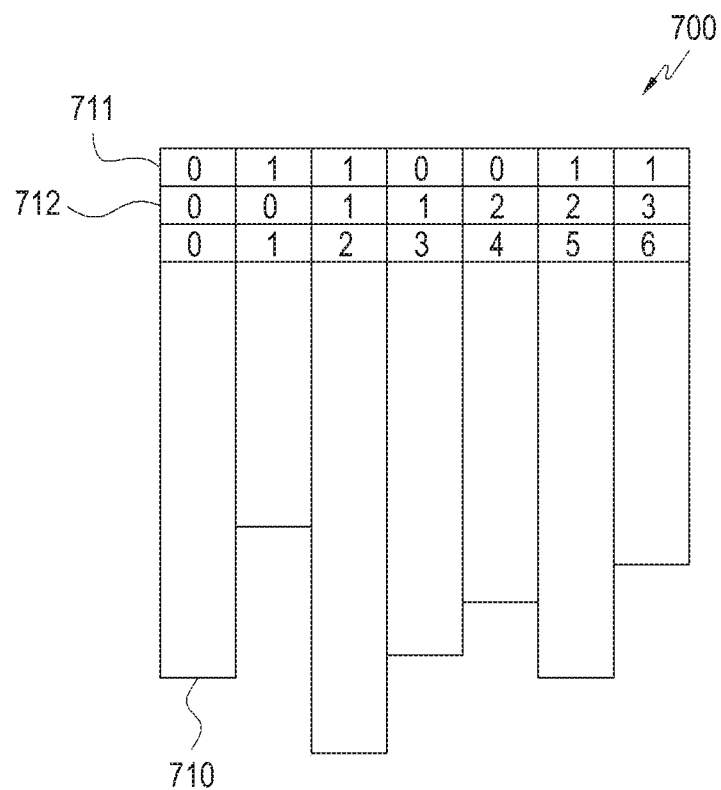
FIG. 7 illustrates an exemplary source packet block configured by a second packet arrangement scheme according to an embodiment of the present disclosure.

FIG. 7 illustrates an exemplary source packet block 700 arranged in the above-described second packet arrangement scheme. Referring to FIG. 7, the source packet block 700 includes seven source packets 710, each including a packet_id field 711, a packet_sequence_number field 712, and a packet_counter field 713 in a header.

The source packets of the source packet block 700 are arranged in an ascending order of the values of the packet_counter fields 713 irrespective of the packet_id fields 711.

Figure 8:
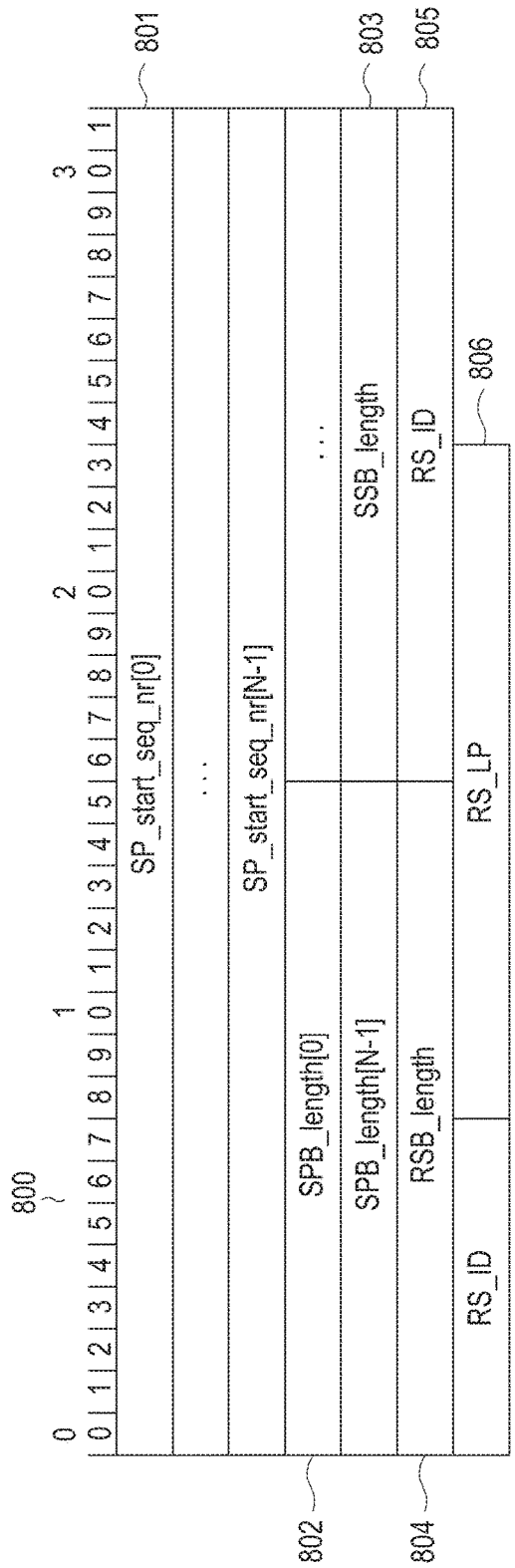
FIG. 8 illustrates an exemplary repair FEC payload identifier (ID), when the first packet arrangement scheme is used according to an embodiment of the present disclosure.

FIG. 8 illustrates an exemplary repair FEC payload ID used in the first packet arrangement scheme.

Referring to FIG. 8, in the case where an FEC source flow is composed of source packets having N types of packet_ids, SP_start_seq_nr[i] 801 has a value equal to that of packet_sequence_number of the first source packet arranged in the source packet block from among source packets having an $i^{th}$ packet_id, and SPB_length[i] 802 represents the number of the source packets having the $i^{th}$ packet_id in the source packet block. An SSB_length field 803 has a value indicating the number of symbols in a first source symbol block corresponding to the source packet block, an RSB_length field 804 represents the number of repair symbols included in a first repair symbol block that protects the first source symbol block, an RS_ID field 805 provides an ID of a repair symbol included in an FEC repair packet including the repair FEC ID, and an RS_LP (repair symbol for length protection) field 806 is a repair symbol that may be determined using the RS_ID field 805 from among the repair symbols of the second repair symbol block.

Figure 9:
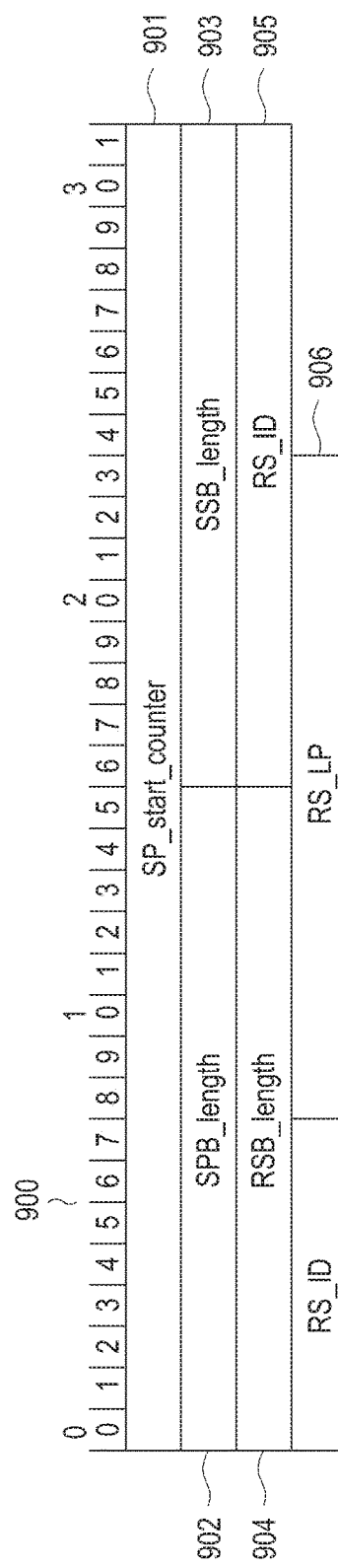
FIG. 9 illustrates an exemplary repair FEC payload ID, when the first packet arrangement scheme is used according to an embodiment of the present disclosure.

FIG. 9 illustrates an exemplary repair FEC payload ID used in the second packet arrangement scheme.

In FIG. 9, an SP_start_counter field 901 has a value equal to a packet_counter value of the first source packet arranged in the source packet block, among the source packets of the source packet block. An SPB_length field 902 represents the number of source packets included in the source packet block. An SSB_length field 903 represents the number of symbols in a first source symbol block corresponding to the source packet block, and an RSB_length field 904 represents the number of repair symbols included in a first repair symbol block that protects the first source symbol block. An RS_ID field 905 provides an ID of a repair symbol included in an FEC repair packet having the repair FEC ID, and an RS_LP (repair symbol for length protection) field 906 is a repair symbol that may be determined using the RS_ID field 905 from among the repair symbols of the second repair symbol block.

Although each of the fields in the embodiments of FIGS. 8 and 9 has a fixed length, a repair FEC payload ID may be reconfigured so that the fields may have variable sizes in order to increase transmission efficiency, which apparently falls within the scope of the present disclosure. Further, while the repair FEC payload ID is described as including one of the repair symbols of the second repair symbol block in the RS_LP fields 806 and 906 in the embodiments of FIGS. 8 and 9, if a repair FEC packet with the repair FEC payload ID carries M repair symbols of the first repair symbol block, M RS_ID fields exist. M is indicated to the receiver by FEC configuration information.

Also, while a repair symbol of the second repair symbol block is described as a part of a repair FEC payload ID in the embodiments of FIGS. 8 and 9, it is clearly to be understood that the repair symbol of the second repair symbol block may be treated as an independent component in regard to the structure of an overall FEC repair packet.

The foregoing embodiments are based on the assumption that the same FEC code is used in encoding a first source symbol block and a second source symbol block. However, different FEC codes may be used in encoding the first source symbol block and the second source symbol block, depending on implementation. Then, FEC configuration information should include information about both the FEC codes, and has a different format depending on implementation of the FEC configuration information.

Figure 10:
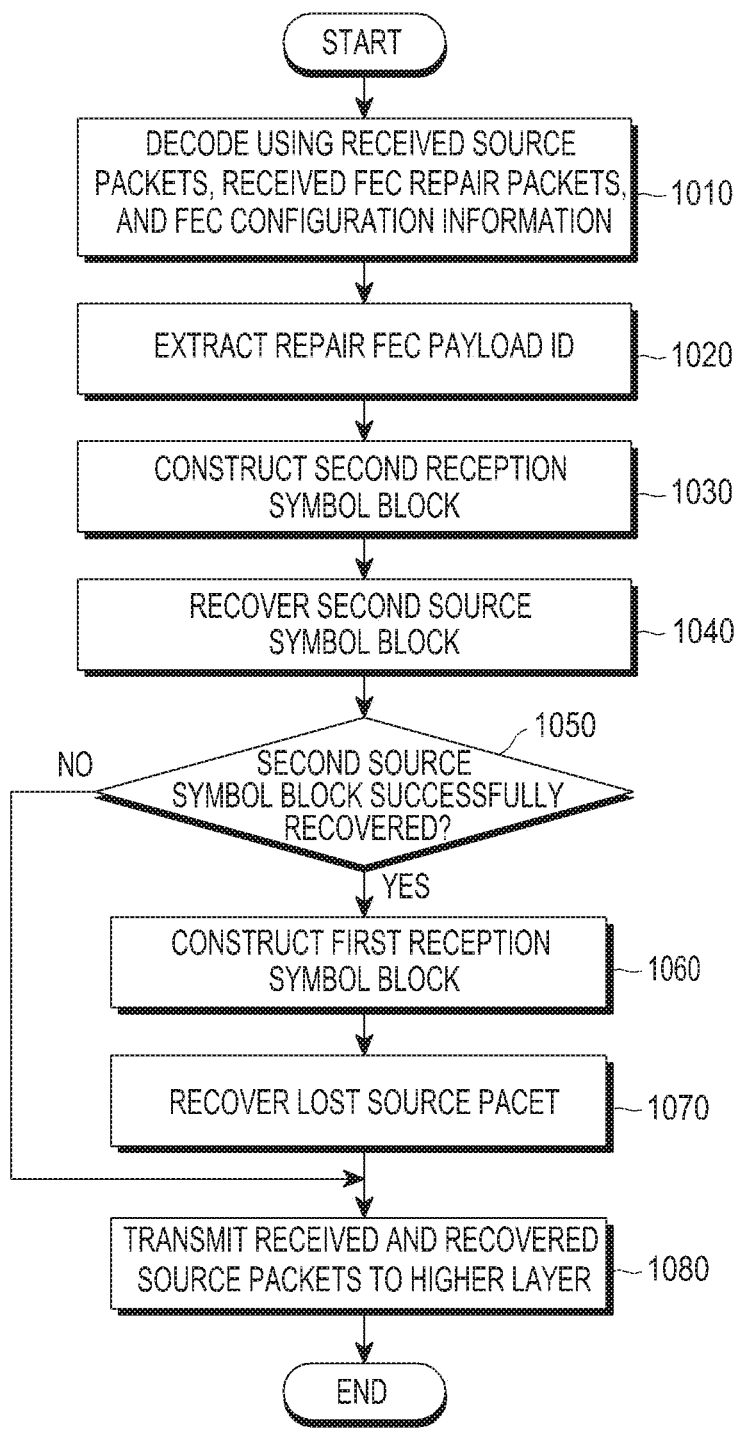
FIG. 10 is a flowchart illustrating an operation of an FEC decoding block according to an embodiment of the present disclosure.

FIG. 10 is a flowchart illustrating an operation of the FEC decoding block 113 according to an embodiment of the present disclosure.

The FEC decoding block 113 (or the controller) starts decoding using FEC configuration information, received source packets, and received FEC repair packets in operation 1010. First, the FEC decoding block 113 (or the controller) extracts repair FEC payload IDs from the FEC repair packets in operation 1020 and then constructs a second reception symbol block using the extracted repair FEC payload IDs and information about the lengths of the received source packets in operation 1030. The FEC decoding block 113 (or the controller) attempts to recover a second source symbol block by performing FEC decoding on the second reception symbol block in operation 1040. Then, the FEC decoding block 113 (or the controller) determines whether the second source symbol block has been recovered perfectly in operation 1050. If the second source symbol block is completely recovered, the FEC decoding block 113 (or the controller) may know the lengths of all source packets including a lost source packet. Therefore, the FEC decoding block 113 (or the controller) constructs a first reception symbol block in operation 1060. In operation 1070, the FEC decoding block 113 (or the controller) attempts to decode an FEC code using the first reception symbol block and then extracts a lost source packet from a recovered part of the coding block. Then, the FEC decoding block 113 (or the controller) transmits the recovered source packets along with the received source packets to a higher layer and ends the procedure. On the contrary, if the second source symbol block is not completely recovered, the FEC decoding block 113 (or the controller) transmits only the received source packets to the higher layer and ends the procedure without constructing the first reception symbol block, because it may know the length of the lost source packet in operation 1080.

Figure 11:
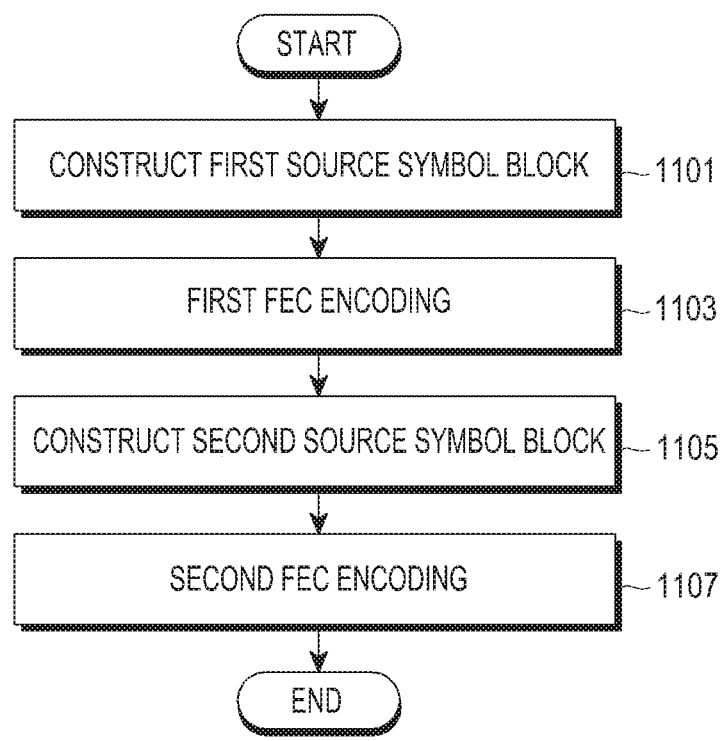
FIG. 11 is a flowchart illustrating an operation of an FEC encoding block according to an embodiment of the present disclosure.

FIG. 11 is a flowchart illustrating an operation of the FEC encoding block 102 according to an embodiment of the present disclosure.

The FEC encoding block 102 (or the controller) constructs a first source symbol block with one or more source symbols of the same length using a source packet block including one or more source packets in operation 1101. One source symbol includes one or more symbol elements in the first source symbol block.

The FEC encoding block 112 (or the controller) performs a first FEC encoding operation corresponding to a predetermined FEC scheme on the first source symbol block in operation 1103.

The FEC encoding block 112 (or the controller) constructs a second source symbol block including information about the length of each source packet of the source packet block in operation 1105. The second source symbol block means the source symbols illustrated in FIG. 5 and may include a padding symbol.

The FEC encoding block 112 (or the controller) performs a second FEC encoding operation corresponding to a predetermined FEC scheme on the second source symbol block in operation 1107. While the disclosure has been shown and described with reference to certain embodiments thereof, it will be understood by those skilled in the art that various changes in form and details may be made therein without departing from the spirit and scope of the disclosure as defined by the appended claims and their equivalents.

Meanwhile, it is known to those skilled in the art that blocks of a flowchart and a combination of flowcharts may be represented and executed by computer program instructions. These computer program instructions may be loaded on a processor of a general purpose computer, special purpose computer or programmable data processing equipment. When the loaded program instructions are executed by the processor, they create means for carrying out functions described in the flowchart. As the computer program instructions may be stored in a computer readable memory that is usable in a specialized computer or a programmable data processing equipment, it is also possible to create articles of manufacture that carry out functions described in the flowchart. As the computer program instructions may be loaded on a computer or a programmable data processing equipment, when executed as processes, they may carry out steps of functions described in the flowchart.

Each block of a flowchart may correspond to a module, a segment or a code containing one or more executable instructions implementing one or more logical functions, or to a part thereof. In some cases, functions described by blocks may be executed in an order different from the listed order. For example, two blocks listed in sequence may be executed at the same time or executed in reverse order.

In the description, the word "unit", "module" or the like may refer to a software component or hardware component such as an FPGA or ASIC capable of carrying out a function or an operation. However, "unit" or the like is not limited to hardware or software. A unit or the like may be configured so as to reside in an addressable storage medium or to drive one or more processors. Units or the like may refer to software components, object-oriented software components, class components, task components, processes, functions, attributes, procedures, subroutines, program code segments, drivers, firmware, microcode, circuits, data, databases, data structures, tables, arrays or variables. A function provided by a component and unit may be a combination of smaller components and units, and may be combined with others to compose large components and units. Components and units may be configured to drive a device or one or more processors in a secure multimedia card.

Those skilled in the art will appreciate that the present disclosure may be carried out in other specific ways than those set forth herein without departing from the spirit and essential characteristics of the present disclosure. The above embodiments are therefore to be construed in all aspects as illustrative and not restrictive. The scope of the present disclosure should be determined by the appended claims and their legal equivalents, not by the above description, and all changes coming within the meaning and equivalency range of the appended claims are intended to be embraced therein.

Meanwhile, preferred embodiments of the present disclosure have been disclosed in the specification and the attached drawings. While specific terms are used, they are used in general meanings to easily describe the present disclosure and help better understanding of the present disclosure, not limiting the scope of the present disclosure. It is clear to those skilled in the art that other medication examples can be implemented based on the spirit of the present disclosure, besides the disclosed embodiments.

The invention claimed is:

1. A method for performing a forward error correction (FEC) encoding in a multimedia system, the method comprising:
    generating at least one source symbol block based on at least one source packet block, wherein the at least one source symbol block includes a first source symbol block generated based on a first source packet block among the at least one source packet block, the first source packet block including a number m of source packets and the first source symbol block including a number n of source symbols;
    performing an FEC encoding on the first source symbol block to generate a repair symbol block;
    generating at least one repair packet based on the repair symbol block; and
    transmitting the at least one repair packet,
    wherein each source symbol included in the first source symbol block has a same number of symbol elements and a first source packet among the m source packets is allocated in one or more symbol elements, the first source packet being allocated from a start position of a first symbol element of the one or more symbol elements,
    the method further comprising:
        generating a length symbol block for the first source packet block; and performing an FEC encoding on the length symbol block to generate at least one length repair symbol for the length symbol block, wherein the length symbol block includes n symbols and the n symbols includes m length symbols and (n-m) zero-padding symbols, each length symbol indicating a length of each of the m source packets, and wherein the at least one length repair symbol is delivered via one or more repair packets of the at least one repair packet.

2. An apparatus for performing a forward error correction (FEC) encoding in a multimedia system, the apparatus comprising at least one processor:

wherein the at least one processor is configured to:

generate at least one source symbol block based on at least one source packet block, wherein the at least one source symbol block includes a first source symbol block generated based on a first source packet block among the at least one source packet block, the first source packet block including a number m of source packets and the first source symbol block including a number n of source symbols, perform an FEC encoding on the first source symbol block to generate a repair symbol block, generate at least one repair packet based on the repair symbol block, and transmit the at least one repair packet, wherein each source symbol included in the first source symbol block has a same number of symbol elements and a first source packet among the m source packets is allocated in one or more symbol elements, the first source packet being allocated from a start position of a first symbol element of the one or more symbol elements, wherein the at least one processor is further configured to:

generate a length symbol block for the first source packet block, and perform an FEC encoding on the length symbol block to generate at least one length repair symbol for the length symbol block, wherein the length symbol block includes n symbols and the n symbols includes m length symbols and (n-m) zero-padding symbols, each length symbol indicating a length of each of the m source packets, and wherein the at least one length repair symbol is delivered via one or more repair packets of the at least one repair packet.

3. A method for performing a forward error correction (FEC) decoding in a multimedia system, the method comprising:

receiving at least one source packet and at least one repair packet; and performing an FEC decoding on at least one source packet based on the at least one repair packet, wherein the at least one repair packet is generated based on a repair symbol block and the repair symbol block is generated by performing an FEC encoding on a first source symbol block including a number n of source symbols, the first source symbol block being generated from a first source packet block and the first source packet block including a number m of source packets, wherein a first repair packet of the at least one repair packet includes at least one length repair symbol, the at least one length repair symbol being generated by performing an FEC encoding on a length symbol block for the first source packet block, and wherein the length symbol block includes n symbols and the n symbols includes m length symbols and (n-m) zero-padding symbols, each length symbol indicating a length of each of the m source packets.

4. An apparatus for performing a forward error correction (FEC) decoding in a multimedia system, the apparatus comprising:

a controller configured to receive at least one source packet and at least one repair packet and perform an FEC decoding on at least one source packet based on the at least one repair packet, wherein the at least one repair packet is generated based on a repair symbol block and the repair symbol block is generated by performing an FEC encoding on a first source symbol block including a number n of source symbols, the first source symbol block being generated from a first source packet block and the first source packet block including a number m of source packets, wherein a first repair packet of the at least one repair packet includes at least one length repair symbol, the at least one length repair symbol being generated by performing an FEC encoding on a length symbol block for the first source packet block, and wherein the length symbol block includes n symbols and the n symbols includes m length symbols and (n-m) zero-padding symbols, each length symbol indicating a length of each of the m source packets.

5. The method of claim 1, wherein the m source packets is allocated based on at least one of packet identifiers (IDs), packet sequence numbers, and packet counters.

6. The apparatus of claim 2, wherein the m source packets is allocated based on at least one of packet identifiers (IDs), packet sequence numbers, and packet counters.

7. The method of claim 3, wherein an arrangement order of the m source packets is determined based on at least one of packet identifiers (IDs), packet sequence numbers, and packet counters.

8. The apparatus of claim 4, wherein an arrangement order of the m source packets is determined based on at least one of packet identifiers (IDs), packet sequence numbers, and packet counters.

* * * * *